US007339962B2

(12) United States Patent
Farrell et al.

(10) Patent No.: US 7,339,962 B2
(45) Date of Patent: Mar. 4, 2008

(54) FREQUENCY LOCKING OF MULTISECTION LASER DIODES (75) Inventors: Thomas Farrell, Park West at Business Park (IE); Tommy Mullane, Park West at Business Park (IE); David MacDonald, Park West at Business Park (IE)

(73) Assignee: Interuniversitair Microelectronics Centrum (IMEC), Leuven (BE)

( * ) Notice: Subject to any disclaimer, the term of this patent is extended or adjusted under 35 U.S.C. 154(b) by 514 days.

(21) Appl. No.: 10/489,115

(22) PCT Filed: Aug. 12, 2002

(86) PCT No.: PCT/IB02/03655

§ 371 (c)(1),
(2), (4) Date: Sep. 13, 2004

(87) PCT Pub. No.: WO03/023916

PCT Pub. Date: Mar. 20, 2003

(65) Prior Publication Data

US 2005/0030986 A1 Feb. 10, 2005

(30) Foreign Application Priority Data

Sep. 10, 2001 (EP) .................................. 01307668

(51) Int. Cl.
*H01S 3/13* (2006.01)
(52) U.S. Cl. .................. 372/32; 372/23; 372/38.01
(58) Field of Classification Search .................. 372/23, 372/38.01, 32
See application file for complete search history.

(56) References Cited

U.S. PATENT DOCUMENTS

2001/0017876 A1* 8/2001 Kner et al. .................... 372/50

2002/0181521 A1* 12/2002 Crowder et al. ......... 372/38.02

FOREIGN PATENT DOCUMENTS

| WO | WO 00/49693 | 8/2000 |
| WO | WO 01/03262 | 1/2001 |

OTHER PUBLICATIONS

Sarlet, G. et al., "Control of Widely Tunable SSG-DBR Lasers For Dense Wavelength Division Multiplexing", Journal of Lightwave Technology, IEEE. New York, US. vol. 18, No. 8, Aug. 2000.

* cited by examiner

*Primary Examiner*—Minsun Oh Harvey
*Assistant Examiner*—Tod T. Van Roy
(74) *Attorney, Agent, or Firm*—McDonnell Boehnen Hulbert & Berghoff LLP (57) ABSTRACT A multi-section laser diode control system comprising a multi-section laser diode (10), microprocessor controller (24), digital-to-analogue converter (28), driver circuit (30) and wavelength locker (14) is modified by inclusion of a locking circuit (40) which generates an analogue correction signal . . . 1 V ph responsive to measurements of the laser output made by the wavelength locker. The analogue correction signal is added to the preset phase voltage V ph asserted by the microprocessor controller to provide fast feedback that bypasses the microprocessor controller. This novel feedback is made possible by avoiding the use of the standard prior art control algorithm which requires a division calculation to be performed. Instead, novel control algorithms based purely on additions, subtractions and multiplications are used. The laser can thus be locked to its target output frequency without having to place slow analogue-to-digital and digital-to-analogue converters in the feedback control path.

10 Claims, 4 Drawing Sheets

FREQUENCY LOCKING OF MULTISECTION LASER DIODES

BACKGROUND OF THE INVENTION

The invention relates to a multi-section laser diode that can be switched between different wavelengths, more especially to a laser system comprising a control circuit that enables a multi-section laser diode to be switched rapidly between different wavelengths.

The original multisection diode laser is a three-section tunable distributed Bragg reflector (DBR) laser. Other types of multisection diode lasers are the sampled grating DBR (SG-DBR) and the superstructure sampled DBR (SSG-DBR) which both have four sections. A further multisection diode laser is the grating-assisted coupler with rear sampled or superstructure grating reflector (GCSR), which also has four sections. A review of such lasers is given in reference [1].

Figure 1:
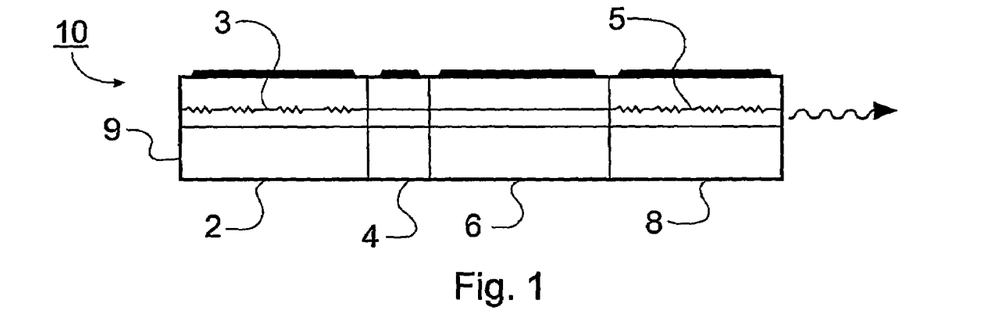
FIG. 1 shows a sampled grating distributed Bragg reflector (SG-DBR) laser diode, as known in the prior art.

FIG. 1 is a basic schematic drawing of a SG-DBR 10. The laser comprises back and front reflector sections 2 and 8 with an intervening gain or active section 6 and phase section 4. An antireflection coating 9 is usually provided on the front and/or rear facet of the chip to avoid facet modes. The back and front reflectors take the form of sampled Bragg gratings 3 and 5. The pitch of the gratings of the back and front reflectors is slightly different, to provide a Vernier tuning effect through varying the current supplied to these sections. The optical path length of the cavity can also be tuned with the phase section, for example by refractive index changes induced by varying the carrier density in this section. A more detailed description of the SG-DBR and other tunable multi-section diode lasers can be found elsewhere [1].

Multisection diode lasers are useful in wavelength division multiplexed (WDM) systems. Example applications are as transmitter sources, as wavelength converters in optical cross connects (OXCs) and for reference sources in heterodyne receivers. Typically, WDM systems have channel spacings conforming to the International Telecommunications Union (ITU) standard G692, which has a fixed point at 193.1 THz and inter-channel spacings at an integer multiple of 50 GHz or 100 GHz. An example dense WDM (DWDM) system could have a 50 GHz channel spacing and range from 191 THz to 196 THz (1525-1560 nm).

The raison d'être of multisection diode lasers is their wavelength tunability. Each section of the laser diode is supplied with a drive current, and the lasing wavelength is a function of the set of drive currents, this function generally being quite complex. Setting the output wavelength of such a laser is thus usually performed by a sophisticated microprocessor controlled control system. As well as the fact that there is a complex relation between output wavelength and the set of drive currents, there is the additional factor that wavelength switching of the laser destroys its thermal equilibrium, which results in transient wavelength instabilities until thermal equilibrium is reached at the new set of drive currents. The time needed for temperature stabilisation can be quite long.

The transient thermal properties consist of two main effects.

A first effect is that, directly after the laser is switched, the thermal gradient across the device to the heat sink upon which it is mounted will be different to that measured at steady state operating conditions for these currents, due to a different heating level generated in the laser as the currents are different. This steady state temperature gradient will reassert itself over a period measured in a timescale from a few hundred nanoseconds to tens of microseconds. Because the device is at a different temperature during this period some temperature tuning of the wavelength occurs. For a positive (negative) change in tuning current the change in temperature will be such that the device is initially colder (hotter) than at equilibrium for those currents and some time will pass before the extra current dissipates enough heat energy to change this. During that period the device will be colder (hotter) than expected so a blue (red) shift from the expected output wavelength will occur.

A second effect takes place over a much longer timescale. The laser is thermally connected to a heat sink of finite thermal mass which has a temperature controller maintaining its temperature. The temperature controller cannot react instantaneously to a change in temperature, which means that with an increase (decrease) in bias current, the heat sink will heat up (down). This in turn means that for a given temperature gradient the device will have a different temperature, because the temperature the gradient is referenced from will be different. This temperature change results in the temperature of the device overshooting and going higher (lower) than would be normal for those currents. This effect will persist until the temperature controller returns the heat sink to its normal temperature, which may take 1-1.5 seconds.

To overcome the problems associated with transient (and non-transient) thermal effects, and also any other effects that cause the wavelength to deviate from the intended wavelength for a predetermined set of drive currents, a wavelength measuring system can be included which supplies measurements of the output wavelength to the control system. The laser drive current can then be adjusted in a feedback loop to provide locking of the output to the desired output wavelength.

Figure 2:
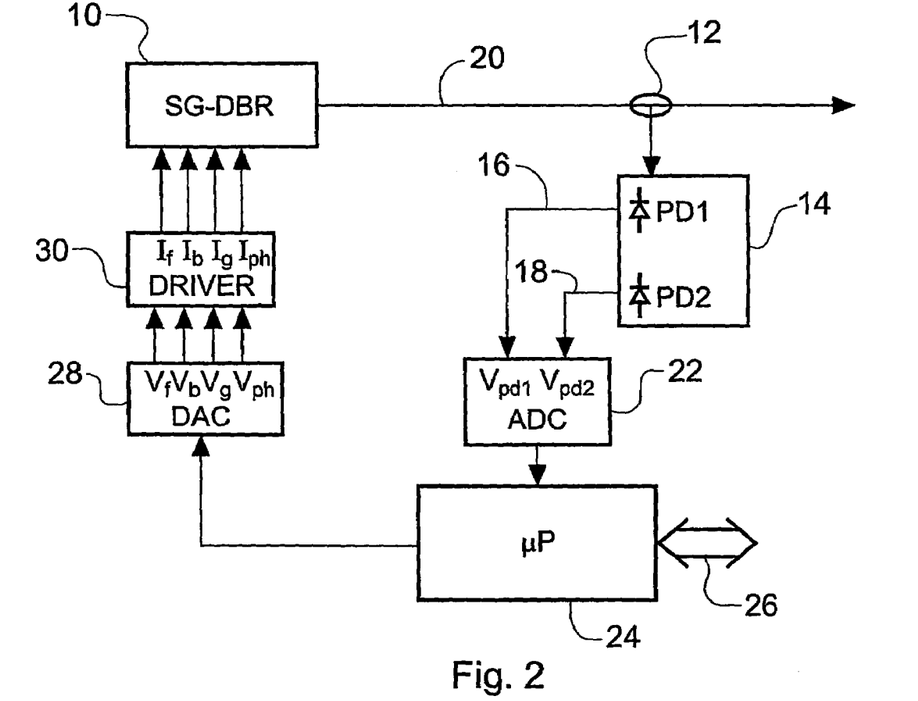
FIG. 2 shows a SG-DBR with an associated feedback control system including a wavelength locker, as known in the prior art.

FIG. 2 shows a typical application example where a SG-DBR laser is used as a source for a WDM system, with a microprocessor control system being provided for wavelength locking.

A SG-DBR 10 has a pigtailed output connection to an optical fibre 20. An optical coupler 12 is arranged in the optical fibre output path 20 to couple off a small proportion of the output power, for example 5%. The coupler 12 may be a fused taper coupler, for example. The part of the output beam diverted off by the coupler 12 is supplied to an optical wavelength locker 14, for example a JDS Uniphase WL5000 Series Wavelength Locker. The optical wavelength locker 14 is a wavelength measuring device based on a Fabry-Perot etalon. For WDM applications, the etalon is designed to have its cyclical frequency response matched to the ITU grid.

Figure 3:
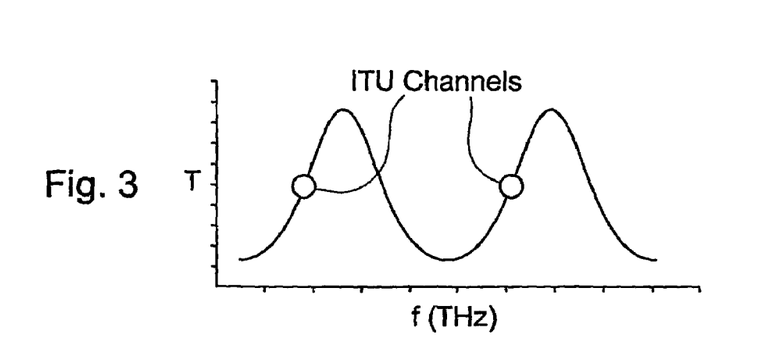
FIG. 3 shows the percentage throughput T of a Fabry-Perot etalon of the wavelength locker as a function of frequency $f$.

FIG. 3 shows the frequency response of the etalon in terms of its percentage throughput T as a function of frequency f. The frequency response of the etalon is such that an ITU channel frequency occurs on the maximum positive slope of the etalon peaks, as indicated in the figure. The optical wavelength locker 14 includes first and second photodiodes PD1 and PD2. Photodiode PD1 is arranged to receive light transmitted by the etalon. Accordingly, with reference to FIG. 3, if the output frequency of the laser is, for example, greater than the ITU frequency, the photodiode PD1 will receive a higher incident power level P1 than it would at the ITU channel frequency. Similarly, if the output frequency of the laser is below the ITU channel frequency, the power P1 incident on the photodiode PD1 will be lower than the value it would have if the laser output was at the ITU channel frequency. The photodiode PD1 thus outputs a voltage $V_{pd1}$ that can be used as a basis for generating an error signal relating to the frequency deviation of the laser output from the ITU channel frequency.

The second photodiode PD2 of the optical wavelength locker is arranged to measure the optical power input to the locker 14, thereby providing a measure of the total output power of the laser in the form of a measurement voltage $V_{pd2}$. The measurement voltages $V_{pd1}$ and $V_{pd2}$ are supplied by respective signal lines 16 and 18 to an analogue-to-digital converter (ADC) 22. The ADC 22 may for example have 12 bit resolution. The ADC 22 supplies the digitised measurement voltages $V_{pd1}$ and $V_{pd2}$ to a microprocessor 24 which may be connected to ancillary computer equipment through an interface 26.

When initially setting the laser 10 to a given ITU channel frequency, the microprocessor 24 refers to a predetermined set of drive voltages $V_f, V_b, V_g$ and $V_{ph}$ for the ITU channel frequency concerned. The sets of drive voltages may be conveniently held in a look-up table, for example. The microprocessor 24 may thus include on-chip memory for this purpose, for example flash memory. To set the laser 10 to a particular ITU channel frequency, the microprocessor 24 asserts a set of voltages to a digital-to-analogue converter (DAC) 28. The DAC 28 may have 12 bit resolution, for example. The DAC 28 then supplies these voltages to a driver circuit 30 which converts the voltages to corresponding drive currents $I_f, I_b, I_g$ and $I_{ph}$ which are then applied to the front reflector, back reflector, gain and phase sections 8, 2, 6 and 4 respectively of the SG-DBR 10.

Feedback from the optical wavelength locker 14 is provided in this control system by the microprocessor 24 continually re-adjusting the set of voltages sent to the DAC 28 on the basis of the measured voltages $V_{pd1}$ and $V_{pd2}$. The feedback adjustment is implemented principally through varying $I_{ph}$, the current applied to the phase section 4 of the SG-DBR 10. The manner in which this is performed is now described. First of all, however, it is noted that, although the active wavelength control of the laser 10 is effected primarily through adjusting the phase current, adjusting the phase current will generally have other consequential effects, such as causing changes in the cavity loss. These can be compensated for by adjusting the gain current $I_g$. (Alternatively, compensation may be achieved using an external variable optical attenuator (VOA) arranged in the output path 20 after the coupler 12.) Consequently, although the wavelength control is principally implemented by varying the phase current, the gain current and possibly either of the other control currents may be changed as part of the feedback. For the sake of simplicity, the following description refers only to variance of the phase current.

The phase current $I_{ph}$ is varied by a correction factor $I_{err}$ defined by the following equation $$I_{err} = k\left(\frac{V_{pd1}}{V_{pd2}} - R_{ITU}\right)$$

where $V_{pd1}$ and $V_{pd2}$ are voltages proportional to the powers P1 and P2, as described above, $R_{ITU}$ is the value of $V_{pd1}/V_{pd2}$ at an ITU channel frequency, and k is a constant factor. Generally a separate value for $R_{ITU}$ will be used for each ITU channel, these values being stored in a look-up table, which may form part of on-chip memory of the controlling microprocessor, or may be held in an EPROM or other memory. The values of $R_{ITU}$ will typically be preset during a calibration performed at the manufacturing stage. Correction of the phase current, by setting $V_{ph} \rightarrow V_{ph} - V_{err}$ in each control cycle, is effective since the error current $I_{err}$ is proportional to the wavelength deviation from the ITU channel wavelength. Thus, if the value of $V_{err}$ is negative, the phase current is increased by a small amount, and vice versa. The procedure repeated until the different between the measured value and the stored value is within a tolerance. The phase current is thus used to provide fine tuning of the output frequency of the laser, with increases in phase current typically causing increases in the output frequency of the laser.

A conventional control system for wavelength locking such as that described above, or in reference [2], is thus based on calculating an error factor from the deviation of the ratio P1/P2 from a desired value of P1/P2 for the wavelength channel concerned, stored as the compound ratio value $R_{ITU}$.

The control loop is thus dependent on performing a division operation. Division operations can be easily performed using a microprocessor, such as a digital signal processor (DSP), and can also be performed by certain types of multiplier components. However, microprocessor and multiplier chip implementations both have limitations.

A drawback of using DSP or other microprocessor chips is that an analogue-to-digital (A-D) sample must be made at the input, and a digital-to-analogue (D-A) output must be made at the output. This takes some time to perform and limits the locking speed of the system.

A drawback of using multiplier chips is their accuracy and bandwidth. The accuracy is typically worse than ±2% and the bandwidth will be limited to a maximum of about 1 MHz. This limits the speed and accuracy of the locking mechanism.

With the prior art control system using microprocessor chips, or with multiplier chips that allow divide operations, it should be possible to improve the switching speed beyond the tens of millisecond range, perhaps up to as fast as tens of microseconds. However, at least with present commercially available electronic components, it is not possible to attain faster switching times.

However, ideally, the control system should have a response time approaching the fundamental limit of the switching time of a diode laser, which is of the order of ten nanoseconds.

SUMMARY OF THE INVENTION

According to the invention there is provided a way of locking a multi-section laser diode to a specified frequency that can be implemented without performing a division, and thus allows the feedback control for wavelength locking to be performed purely with simple electronic components such as adders, subtractors and multipliers.

Specifically, a microprocessor is not present in the feedback path, so that slow digital-to-analogue and analogue-to-digital conversions are not part of the control loop. As a result very rapid wavelength locking can be achieved. This opens the way for using multi-section laser diodes for applications which require rapid switching between frequency channels. For example, a laser system according to the invention can be used for optical packet switching networks.

According to one aspect of the invention there is provided a system comprising: a multi-section diode laser comprising a plurality of sections having respective control inputs; a memory storing a plurality of sets of control input values, each set of control input values corresponding to a target output frequency of the laser; a microprocessor controller operable to select one of the sets of control input values and assert it through a digital-to-analogue converter to supply a corresponding set of analogue control signals to the laser via its control inputs; and a locking circuit arranged to generate and output an analogue correction signal responsive to measurements of the laser output, the analogue correction signal being combined with one of the analogue control signals prior to supply of that control signal to the associated control input of the laser, thereby to lock the laser to the target output frequency.

The microprocessor, with its slow ADC and DAC input/output delays is thus bypassed by a high speed feedback control path based on analogue signals In one embodiment, only one analogue correction signal is used. In another embodiment the locking circuit is arranged to generate and output a further analogue correction signal responsive to measurements of the laser output, the further analogue correction signal being combined with a further one of the analogue control signals prior to supply of that control signal to the associated control input of the laser.

For the laser output measurements, there is provided in embodiments of the invention: a frequency selective element having a cyclical frequency response matched to the wavelength channels and arranged to receive at least a part of the laser output; a first detector operable to supply the locking circuit with a first power value indicative of the power being transmitted by the frequency selective element; and a second detector operable to supply the locking circuit with a second power value indicative of the total power being output by the laser.

According to another aspect of the invention, there is provided a process for controlling a laser comprising a plurality of sections having respective control inputs for receiving respective analogue control signals, the process comprising: storing in a memory a plurality of sets of control input values, each set of control input values corresponding to a target output frequency of the laser; setting an output channel of the laser by using a microprocessor to assert one of the sets of control input values through an digital-to-analogue converter and subsequent driver circuitry to generate a corresponding set of analogue control signals that are supplied to the control inputs of the laser; and locking the laser to the target output frequency by generating and outputting an analogue correction signal responsive to measurements of the laser output, the analogue correction signal being combined with one of the analogue control signals prior to supply of that control signal to the associated control input of the laser.

According to a first embodiment of the invention there is provided a control process for locking a laser to any one of a plurality of desired wavelengths lying in respective wavelength channels, comprising:

(a) setting the laser to output within one of the wavelength channels;
(b) measuring a first power value indicative of the power being transmitted by a frequency selective element having a cyclical frequency response matched to the wavelength channels;
(c) measuring a second power value indicative of the total power being output by the laser;
(d) determining a first error value from the difference between the first power value and a desired first power value for the wavelength channel currently set;
(e) determining a second error value from the difference between the second power value and a desired second power value for the wavelength channel currently set; and
(f) determining a laser control parameter from the difference between one of the first and second error values and a constant factor multiplied by the other of the first and second error values;
(g) using the laser control parameter to lock the laser to the desired wavelength.

In the first embodiment, the constant factor for the wavelength channel currently set may be equal to the first desired power value divided by the second desired power value. The laser may have a phase section and the laser control parameter is used to adjust a phase current supplied to the phase section. The second error value may be used to determine a further laser control parameter that is applied to adjust gain or attenuation in the laser or its output.

According to a second embodiment of the invention there is provided a control process for locking a laser to any one of a plurality of desired wavelengths lying in respective wavelength channels, comprising:

(a) setting the laser to output within one of the wavelength channels;
(b) measuring a first power value indicative of the power being output by the laser at the desired wavelength;
(c) measuring a second power value indicative of the total power being output by the laser;
(d) determining a first error value from the difference between the first power value and a desired first power value for the wavelength channel currently set;
(e) determining a second error value from the difference between the second power value and a desired second power value for the wavelength channel currently set; and
(f) determining first and second laser control parameters from the first and second error values respectively, and using the first and second laser control parameters to adjust first and second control inputs to the laser respectively.

In the second embodiment, the first control input may be a phase current of a phase section of the laser. The second control input may be a gain current applied to a gain section of the laser, or a control current applied to a variable attenuator or gain element arranged in the output path of the laser.

According to the first embodiment of the invention, there is also provided a laser system comprising:

(a) a wavelength tunable laser source for providing a laser output in any one of a plurality of wavelength channels;
(c) a frequency selective element having a cyclical frequency response matched to the wavelength channels and arranged to receive at least a part of the laser output; and
(d) a first detector operable to measure a first power value indicative of the power being transmitted by the frequency selective element;
(e) a second detector operable to measure a second power value indicative of the total power being output by the laser; and
(b) a controller arranged to receive the first and second power values from the first and second detectors, and operable in a channel setting mode to set the laser source to output in any one of the plurality of wavelength channels and in a wavelength locking mode to lock the laser output to a desired wavelength in each wavelength channel using feedback control, wherein the feedback control comprises:

(i) determining a first error value from the difference between the first power value and a desired first power value for the wavelength channel currently set;

(ii) determining a second error value from the difference between the second power value and a desired second power value for the wavelength channel currently set; and (iii) determining a laser control parameter from the difference between the first error value and a constant factor multiplied by the second error value; and (iv) using the laser control parameter to output a control signal to the laser so as to stabilise the laser output to the desired wavelength.

Advantageously, the wavelength locking mode may be deactivated for a period during the channel setting mode, for example a period of 1-50 nanoseconds, more preferably 5-30, still more preferably 10-20 nanoseconds.

BRIEF DESCRIPTION OF THE DRAWINGS

For a better understanding of the invention and to show how the same may be carried into effect reference is now made by way of example to the accompanying drawings in which.

DETAILED DESCRIPTION

Figure 4:
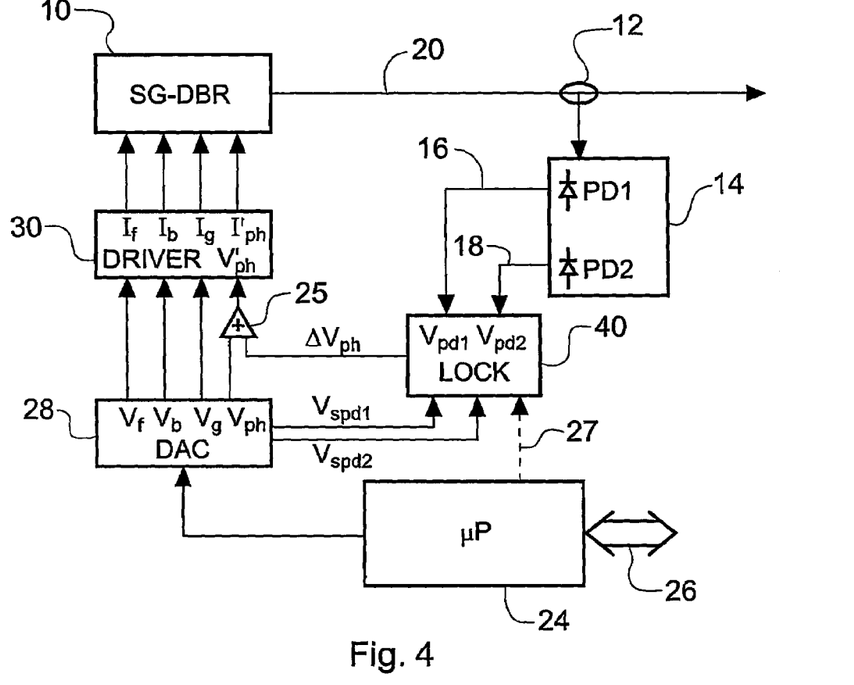
FIG. 4 shows a SG-DBR with an associated feedback control system comprising a locking circuit according to a first embodiment of the invention.

FIG. 4 shows a laser with an associated control system according to a first embodiment of the invention. Many of the components will be recognised as being common to the prior art example illustrated in FIG. 2 and described above. For clarity, the same reference numerals are used to refer to like or comparable components.

A SG-DBR 10 is used as the laser source and has a pigtailed output connection to an optical fibre 20. A microprocessor 24, for example a DSP, is provided for setting the laser 10 to a given ITU channel frequency (assuming a DWDM application). The microprocessor 24 may be connected to ancillary computer equipment through an interface 26. The microprocessor 24 refers to a predetermined set of drive voltages $V_f$, $V_b$, $V_g$ and $V_{ph}$ for the ITU channel frequency concerned. The sets of drive voltages may be conveniently held in a look-up table, for example. The microprocessor 24 may thus include on-chip memory for this purpose, for example flash memory. Alternatively, remote memory such as EPROM may be used and accessed by the microprocessor 24 through the interface 26. To set the laser 10 to a particular ITU channel frequency, the microprocessor 24 asserts a set of voltages to a digital-to-analogue converter (DAC) 28. The DAC 28 may have 12 bit resolution, for example. The DAC 28 supplies the voltages $V_f$, $V_b$, $V_g$ and $V_{ph}$ to a driver circuit 30. In the case of the phase control, an adder 25 is arranged between the DAC 28 and the driver circuit 30, having as a first input the phase voltage $V_{ph}$ from the DAC 28 and a correction voltage $\Delta V_{ph}$ as a second input. The error correction of the phase voltage is described in more detail further below. The driver circuit 30 converts the voltages to corresponding drive currents $I_f$, $I_b$, $I_g$ and $I_{ph}$ which are then applied to the front reflector, back reflector, gain and phase sections 8, 2, 6 and 4 respectively of the SG-DBR 10.

The DAC 28 can also be used to shape the pulse as the currents are changed from one operating point to another. In this way the laser can switch faster if an overshoot is provided.

In the output path 20 of the laser 10, an optical coupler 12 is arranged to couple off a small proportion of the output power, for example 5%. The coupler 12 may be a fused taper coupler, for example. The part of the output beam diverted off by the coupler 12 is supplied to an optical wavelength locker 14, for example a JDS Uniphase WL5000 Series Wavelength Locker. The optical wavelength locker 14 is a wavelength measuring device based on a Fabry-Perot etalon. (Alternatively, a long grating may be used instead of the etalon.) For WDM applications, the etalon is designed to have its cyclical frequency response matched to the ITU grid. The frequency response of the etalon is as already described with reference to FIG. 3.

The optical wavelength locker 14 includes first and second photodiodes PD1 and PD2. Photodiode PD1 is arranged to receive light transmitted by the etalon. Accordingly, with reference to FIG. 3, if the output frequency of the laser is greater than the ITU frequency, the photodiode PD1 will receive a higher incident power level P1 than it would at the ITU channel frequency. Similarly, if the output frequency of the laser is below the ITU channel frequency, the power P1 incident on the photodiode PD1 will be lower than the value it would have if the laser output was at the ITU channel frequency. (In an alternative design, the signs will be reversed if the ITU channel frequencies are aligned with the falling etalon flanks, instead of the rising flanks as illustrated in FIG. 3.) The photodiode PD1 thus outputs a voltage $V_{pd1}$ that can be used as a basis for generating an error signal relating to the frequency deviation of the laser output from the ITU channel frequency. The second photodiode PD2 of the optical wavelength locker is arranged to measure the optical power input to the locker 14, thereby providing a measure of the total output power of the laser in the form of a measurement voltage $V_{pd2}$. The measurement voltages $V_{pd1}$ and $V_{pd2}$ are supplied by respective signal lines 16 and 18 to a locking circuit 40.

The purpose of the locking circuit 40 is to generate the correction voltage $\Delta V_{ph}$ which is added to the phase voltage $V_{ph}$ generated by the DAC 28 using the adder 25, so that the phase voltage supplied to the driver circuit 30 is given by $V_{ph}' = V_{ph} + \Delta V_{ph}$.

Figure 5:
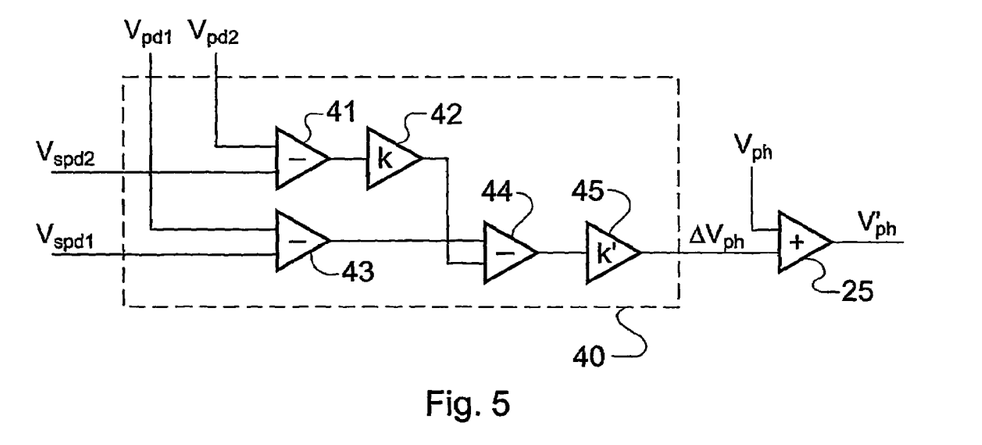
FIG. 5 shows the locking circuit of FIG. 4 in more detail.

FIG. 5 shows the locking circuit in more detail. The locking circuit receives four input signals, the measured voltages $V_{pd1}$ and $V_{pd2}$, and two preset calibration voltages $V_{spd1}$ and $V_{spd2}$ which are the values that $V_{pd1}$ and $V_{pd2}$ should have when the laser is outputting at the desired ITU channel frequency (or other target output frequency). The voltages $V_{spd1}$ and $V_{spd2}$ are supplied to the locking circuit by the microprocessor 24 via the DAC 28. The inputs $V_{spd1}$ and $V_{spd2}$ are specific to each ITU channel and are obtained during factory calibration of the system by setting the laser to output at each ITU channel frequency and measuring $V_{pd1}$ and $V_{pd2}$. Therefore, if $V_{pd1}=V_{spd1}$ and $V_{pd2}=V_{spd2}$ then the laser is outputting at the correct frequency and $V_{ph}=V_{ph}'$.

The locking circuit operates as follows. The voltages $V_{pd2}-V_{spd2}$ are combined by subtraction in a first logic subtractor 41 to obtain a deviation value for $V_{pd2}$ from its calibration value. The consequent result $V_{pd2}-V_{spd2}$ is then multiplied by a constant factor k in a first logic multiplier 42. The factor k is obtained from measurements of the locker and corresponds to the value of the ratio $V_{pd1}/V_{pd2}$ that is obtained at the ITU channel frequency concerned. The factor k is constant and embedded in the electronics.

The voltages $V_{pd1}-V_{spd1}$ are combined by subtraction in a second logic subtractor 43 to obtain a deviation value for $V_{pd1}$ from its calibration value. The other result k $(V_{pd2}-V_{spd2})$ is then subtracted from $V_{pd1}-V_{spd1}$ in a third logical subtractor 44. The factor k thus serves as a weighting factor when combining the two deviations, to ensure that they are equally weighted.

Therefore, if the output power of the device changes, or the locker alignment moves causing a change in the voltages received at $V_{pd1}$ and $V_{pd2}$, this can be normalised out without the need for a divide.

The combined result output from the third subtractor 44 is then scaled by a factor k' using a second multiplier 45, so that the output signal from the second multiplier can be expressed by $$\Delta V_{ph}=k'((V_{pd1}-V_{spd1})-k(V_{pd2}-V_{spd2}))$$

where $\Delta V_{ph}$ is the voltage which is to be added to the precalibrated phase voltage $V_{ph}$ supplied by the microprocessor 24. The factor k' is a lumped parameter, which may be considered to represent the proportional term in the feedback loop that determines the loop gain.

The logic elements and other circuit elements of the locking circuit may be realised in conventional hardware, or with programmable logic, for example in a field programmable gate array (FPGA).

While in practice the constant factor k is not exactly equal to $V_{pd1}/V_{pd2}$ it will be close enough to make this term small. For example, if f=0.5 (indicating a 3 dB drop in the output power of the device) and the mismatch between k and the actual $V_{pd1}/V_{pd2}$ is 1% then there is an overall error of 0.5%. This would cause a drift in the output frequency of the laser of <200 MHz which is well within a typical specification limit of +/−2.5 GHz.

The reason that k is not exactly equal to $V_{pd1}/V_{pd2}$ is that this ratio will change slightly for different ITU wavelengths, typically with a 1% spread over a few tens of manometres around a wavelength of 1.5 microns.

In summary, the locking circuit 40 is able to provide a correction factor for the phase current using only analogue circuit elements, and without the need for a microprocessor. This is achieved by using a control algorithm based on additions, subtractions and multiplications, and no division. A fast feedback control loop is thus added that bypasses the microprocessor used to set the laser drive currents. The feedback control is based on separately determining deviations of the measured voltages $V_{pd1}$ and $V_{pd2}$ from stored target values of these parameters $V_{spd1}$ and $V_{spd2}$. This differs from the standard prior art control algorithm that is based on determining a deviation from a target ratio of these voltage values. The memory configuration will thus be different from the prior art in that for each set of control voltages, $V_f$ $V_b$ $V_g$ and $V_{ph}$, for a given target output frequency, there will be stored two values $V_{spd1}$ and $V_{spd2}$, instead of a single compound value $R_{ITU}$, where $V_{spd1}/V_{spd2}=R_{ITU}$.

Advantageously, the microprocessor 24 is able to switch the locking circuit 40 off and on. A control line 27 for this purpose is shown in FIG. 4 with a dashed line. Specifically, there is a preferred mode of operation in which the locking circuit is disabled during each frequency switching event. In other words, each time the microprocessor 24 asserts a new set of control voltages $V_f$ $V_b$ $V_g$ and $V_{ph}$ to the DAC 28, it switches off the locking circuit 40 at the same time or shortly beforehand, and switches the locking circuit 40 back on shortly thereafter, for example a few tens of nanoseconds after switching, e.g. 10, 20, 30 or 40 nanoseconds. This allows the laser to attain rough stabilisation after switching prior to activation of the locking circuit feedback. The delay in enabling the locking circuit after switching allows the laser to switch the output wavelength and then equalise the carrier effects, so that, when the locking is enabled, the laser output wavelength is within the locking range of the system, i.e. within the target ITU channel (even if not close to the centre frequency of the channel). The locking can then compensate for ageing effects and thermal effects.

It is also possible to use a feedforward mechanism during the initial transition, to ensure the laser jumps to a wavelength in the locking range of the device.

It will also be understood that the measurement voltages $V_{pd1}$ and $V_{pd2}$ may be additionally supplied to the microprocessor 24 through a suitable ADC (not shown), as shown in the prior art example of FIG. 2. The measurement voltages may then be used by the microprocessor 24 to modify the output voltages $V_f$ $V_b$ $V_g$ and $V_{ph}$ supplied to the DAC 28, thereby providing additional feedback similar to that of the prior art, operating to correct slowly varying changes in the wavelength having time constants in the micro- or millisecond range.

The error signal $\Delta V_{ph}$ output from the locking circuit 40 can also be used to generate a global system error. If the value of the correction voltage exceeds a certain value, it can be inferred that the feedback control is not operating correctly, from which it can be further inferred that the system has suffered a global failure. For example, the laser may not be outputting in the correct wavelength range or with stable power at a suitable level. In one implementation, a global error signal and system shutdown can be generated by supplying the error signal from the locking circuit to the microprocessor 24 via a suitable ADC (not shown) or logic signal.

Figure 6:
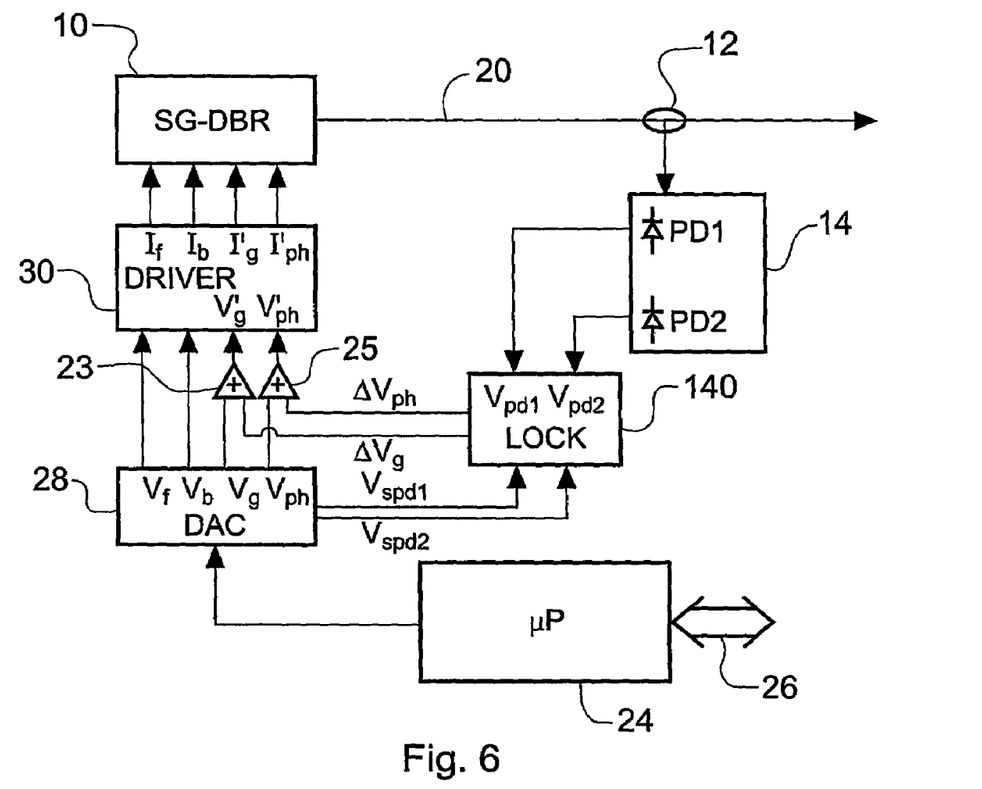
FIG. 6 shows a SG-DBR with an associated feedback control system comprising an alternative locking circuit according to a second embodiment of the invention.

FIG. 6 shows a laser with an associated control system according to a second embodiment of the invention. Many of the components will be recognised as being common to the first embodiment, namely a SG-DBR laser source 10 with a pigtailed output connection to an optical fibre 20, a microprocessor 24 having an associated interface 26 and being connected to control the laser 10 through a DAC 28 and driver circuit 30, with feedback being provided by a wavelength locker 14 and locking circuit 140. For the sake of brevity, the second embodiment will be described in terms of its similarities to and differences from the first embodiment. As in the first embodiment, the second embodiment uses a locking circuit to provide high speed feedback for wavelength locking that bypasses the microprocessor 24 and that is based on four input signals, namely the measurement signals $V_{pd1}$ and $V_{pd2}$, and the calibration signals $V_{spd1}$ and $V_{spd2}$. These voltages having identical significance and origin to those of the first embodiment. The second embodiment differs from the first embodiment by virtue of the internal design of the locking circuit, and the fact that the locking circuit provides two outputs, one for correcting the phase voltage $\Delta V_{ph}$ (as in the first embodiment) and another for correcting the gain voltage $\Delta V_g$ which are added to the microprocessor values for the phase and gain voltages by respective adders 25 and 23 interposed between the DAC 28 and driver circuit 30, as illustrated so that the driver circuit receives gain and phase voltages $V_g'$ and $V_{ph}'$ respectively, where $V_{ph}'=V_{ph}+\Delta V_{ph}$ and $V_g'=V_g+\Delta V_g$.

Figure 7:
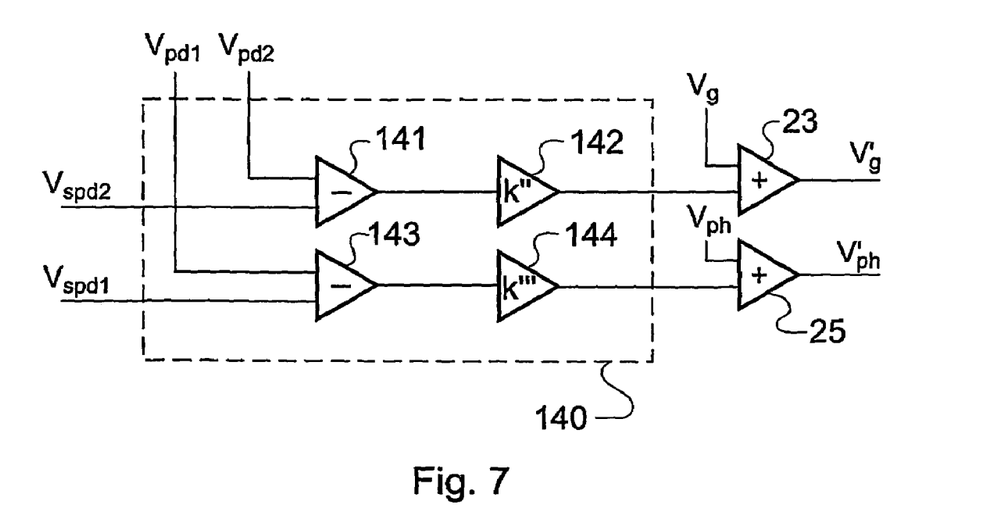
FIG. 7 shows the locking circuit of FIG. 6 in more detail.

FIG. 7 shows the internal structure of the locking circuit 140 of the second embodiment. The locking circuit operates as follows. The voltages $V_{pd2}-V_{spd2}$, representing measured total output power of the laser, are combined by subtraction in a first logic subtractor 141 to obtain a deviation value of the total output power from its calibration value. The consequent result $V_{pd2}-V_{spd2}$ is then multiplied by a constant factor k" in a first logic multiplier 142.

The voltages $V_{pd1}-V_{spd1}$, representing power passed through the etalon, or other wavelength selective element, are combined by subtraction in a second logic subtractor 143 to obtain a deviation value for $V_{pd1}$ from its calibration value.

The deviation values associated with $V_{pd1}$ and $V_{pd2}$ represent the two voltage correction signals for phase and gain respectively, and are supplied to separate outputs of the locking circuit to the adders 25 and 23 respectively in order to correct the corresponding drive currents supplied to the laser. As an alternative, the deviation signal for the gain could be supplied to a variable attenuator or optical amplifier arranged in the laser's output path, for example in series with the output fibre 20. Thus, as in the first embodiment, the second embodiment provides rapid feedback for wavelength locking without the need to use a microprocessor or other component for performing division.

It will be understood that the variations described in relation to the first embodiment may also be applied to the second embodiment.

Figure 8:
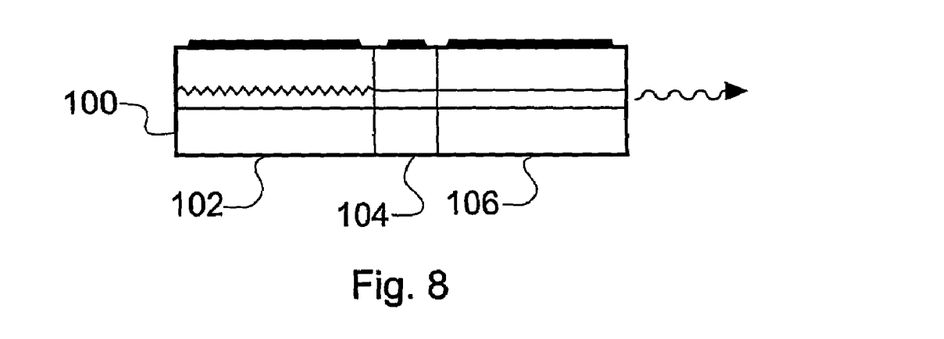
FIG. 8 shows a distributed Bragg reflector (DBR) laser diode.
Figure 9:
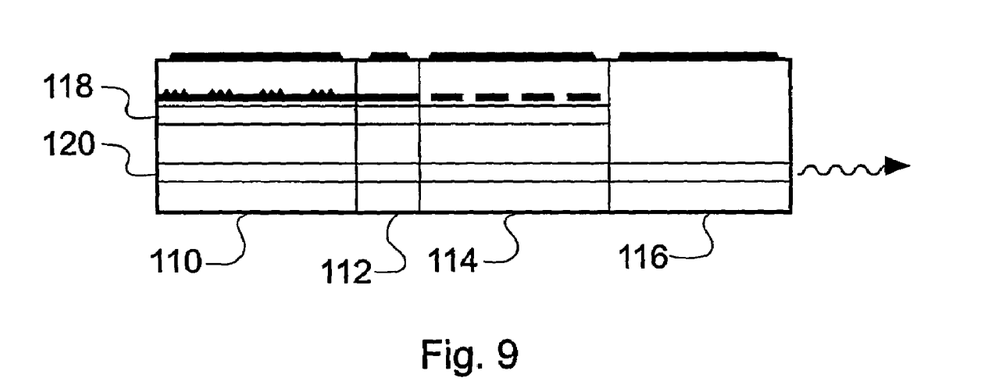
FIG. 9 shows a grating-assisted coupler with rear sampled or superstructure grating reflector (GCSR) laser diode.

It will also be understood that in further embodiments the SG-DBR may be replaced with a SG-DBR, or with a DBR or GCSR, as shown in FIGS. 8 and 9 respectively, or with any other diode laser with a phase section.

FIG. 8 is a basic schematic drawing of a DBR. The laser comprises a back reflector section 102 with a gain or active section 106 and a phase section 104. An antireflection coating 100 is usually provided on the rear facet of the chip to avoid facet modes. The optical path length of the cavity can also be tuned with the phase section 104.

FIG. 9 is a basic schematic drawing of a GCSR. The laser comprises a SG-DBR reflector section 110, a phase section 112, a coupler section 1114, and a gain or active section 116. Two planar waveguides 118 and 120 extend through the SG-DBR, phase and coupler sections, with only the lower waveguide 120 extending through the gain section.

Annex 1

In the following, it is shown that the control algorithm of the first embodiment reduces to the same mathematical form as the standard prior art control algorithm based on determining deviation of $V_{pd1}/V_{pd2}$ from $V_{spd1}/V_{spd2}$, thereby providing proof that feedback control according to the first embodiment is stable.

The phase current adjustment $I_{err}$ is obtained in the first embodiment of the invention using the following equation $$I_{err}=k_1((V_{pd2}-V_{spd2})-k_2(V_{pd1}-V_{spd1})) \quad \text{eq. 1}$$

where
$V_{pd2}$=The voltage on the photodetector PD2 (Etalon power from Locker)
$V_{spd2}$=The set value from the DAC SPD2
$V_{pd1}$=The voltage on the photodetector PD1 (Direct power from Locker)
$V_{spd1}$=The set voltage from the DAC SPD1
$I_{err}$=The current to be added to the phase section of the laser
and where $k_1$, $k_2$ are constants Locally to an ITU channel the following equation is true $$V_{pd2}=(m_1\lambda+C_1)P_0$$

and $$V_{pd1}=aP_0$$

where $P_0$ is the output light power from the laser and a, $m_1$, $C_1$ are constants.

In operation $V_{spd2}$ and $V_{spd1}$ are chosen to be equal to $V_{pd2}$ and $V_{pd1}$ while the laser is at an ITU channel, therefore $$V_{spd2}=(m_1\lambda_{ITU}+C_1)P_{ITU}$$

and $$V_{spd1}=aP_{ITU}$$

The locking mechanism adjusts the wavelength of the laser to the ITU channel if the laser is not already there, so next we assume that the output power and the wavelength of the laser are not at the correct levels, therefore $$V_{pd2}=(m_1(\lambda_{ITU}+\Delta\lambda)+C_1)(P_{ITU}+\Delta P)$$

and $$V_{pd1}=a(P_{ITU}+\Delta P)$$

Substituting these into eq. 1. gives $$I_{err}=k_1(((m_1(\lambda_{ITU}+\Delta\lambda)+C_1)(P_{ITU}+\Delta P)-(m_1\lambda_{ITU}+C_1)P_{ITU})-k_2(a(P_{ITU}+\Delta P)-aP_{ITU}))$$

Which reduces to $$I_{err}=k_1((m_1\lambda_{ITU}\Delta P+m_1\Delta\lambda P_{ITU}+m_1\Delta\lambda\Delta P+C_1\Delta P)-k_2(a\Delta P))$$

If $k_2$ is chosen to be as below $$k_2 = \frac{V_{spd2}}{V_{spd1}} = \frac{m_1\lambda_{ITU}+C_1}{a}$$

it can be found that $$I_{err}=k_1(m_1\Delta\lambda P_{ITU}+m_1\Delta\lambda\Delta P) \text{ where } m_1\Delta\lambda\Delta P\to 0$$

$$I_{err}=k_1(m_1\Delta\lambda P_{ITU})$$

therefore as $k_1$, $m_1$, $P_{ITU}$ are all constants $I_{err}$ is directly proportional to the change in wavelength from the desired set point.

By contrast, the conventional technique is to use the following equation $$I_{err} = k\left(\frac{V_{pd1}}{V_{pd2}} - R_{ITU}\right)$$

where $V_{pd1}$ and $V_{pd2}$ are as before and $R_{ITU}$ is the value of $V_{pd1}/V_{pd2}$ at an ITU channel. Therefore $$I_{err} = k\left(\frac{a(P_{ITU} + \Delta P)}{(m_2(\lambda_{ITU} + \Delta\lambda) + C_2)(P_{ITU} + \Delta P)} - R_{ITU}\right)$$

$$R_{ITU} = \frac{aP_{ITU}}{m_2\lambda_{ITU} + C_2}$$

It can be shown that in the region of an ITU channel by using a Taylor Expansion $$\Delta V_{pd2} \propto -\frac{1}{\Delta V_{pd2}} \text{ where } \Delta V_{pd2} \ll V_{pd2}$$

Therefore $$V_{pd2} = \frac{P}{-m_3(\lambda_{ITU} + \Delta\lambda) + C_3} \text{ where } \Delta\lambda \ll \lambda_{ITU}$$

i.e. in the region of an ITU channel. This is true if the loop gain of the system is high, and hence $$I_{err} = k\left(\frac{a(P_{ITU} + \Delta P)(-m_3(\lambda_{ITU} + \Delta\lambda) + C_3)}{(P_{ITU} + \Delta P)} - \frac{aP_{ITU}(-m_3\lambda_{ITU} + C_3)}{P_{ITU}}\right)$$

$$I_{err} = -k(am_3\Delta\lambda)$$

Therefore by selecting the correct relationship between k and $k_2$, $I_{err}$ is the same in both methods, the important difference being that in the method of the invention computation of $I_{err}$ does not require a division operation. It is noted that there is a P term in the method of the first embodiment of the invention, but this can be made constant by using gain equalisation in the laser so that the laser has the same output power for all channels. Moreover, it will be understood that $I_{err}$ corresponds to the current change induced by changing the phase voltage $V_{ph}$ by the correction increment $\Delta V_{ph}$ in the description of the first embodiment.

REFERENCES

1. Chapter 2 of PhD by Geert Sarlet, University of Gent, Belgium (September 2000) "Tunable laser diodes for WDM communication—Methods for control and characterisation"
2. WO-A-0049693 (Andersson)

The invention claimed is:

1. A control process for locking a laser to any one of a plurality of desired wavelengths lying in respective wavelength channels, comprising:
   a. setting the laser to output within one of the wavelength channels;
   b. measuring a first power value indicative of the power being transmitted by a frequency selective element having a frequency response matched to the wavelength channels;
   c. measuring a second power value indicative of the total power being output by the laser;
   d. determining a first error value from the difference between the first power value and a desired first power value for the wavelength channel currently set;
   e. determining a second error value from the difference between the second power value and a desired second power value for the wavelength channel currently set;
   f. determining a laser control parameter from the difference between one of the first and second error values and a constant factor multiplied by the other of the first and second error values; and
   g. using the laser control parameter to lock the laser to the desired wavelength.

2. The control process according to claim 1, wherein the constant factor for the wavelength channel currently set is equal to the first desired power value divided by the second desired power value.

3. The control process according to claim 1, wherein the laser has a phase section and the laser control parameter is used to adjust a phase current supplied to the phase section.

4. The control process according to claim 1, wherein the second error value is used to determine a further laser control parameter that is applied to adjust gain or attenuation in the laser or its output.

5. The control process according to claim 1, wherein the laser control parameter is phase current of a phase section of the laser.

6. The control process according to claim 1, wherein the laser control parameter is a gain current applied to a gain section of the laser, or a control current applied to a variable attenuator or gain element arranged in the output path of the laser.

7. A laser system comprising:
   (a) a wavelength tunable laser source for providing a laser output in any one of a plurality of wavelength channels;
   (b) a frequency selective element having a frequency response matched to the wavelength channels and arranged to receive at least a part of the laser output; and
   (c) a first detector operable to measure a first power value indicative of the power being transmitted by the frequency selective element;
   (d) a second detector operable to measure a second power value indicative of the total power being output by the laser; and
   (e) a controller arranged to receive the first and second power values from the first and second detectors, and operable in a channel setting mode to set the laser source to output in any one of the plurality of wavelength channels and in a wavelength locking mode to lock the laser output to a desired wavelength in each wavelength channel using feedback control, wherein the feedback control comprises:
      (i) determining a first error value from the difference between the first power value and a desired first power value for the wavelength channel currently set;
      (ii) determining a second error value from the difference between the second power value and a desired second power value for the wavelength channel currently set;
      (iii) determining a laser control parameter from the difference between the first error value and a constant factor multiplied by the second error value; and
      (iv) using the laser control parameter to output a control signal to the laser so as to stabilise the laser output to the desired wavelength.

8. The laser system according to claim 7, wherein:
   the first detector is operable to supply a locking circuit with the first power value indicative of the power being transmitted by the frequency selective element; and the second detector is operable to supply the locking circuit with the second power value indicative of the total power being output by the laser.

9. The laser system according to claim 7, wherein the laser source comprises a phase section and the control parameter is a phase current supplied to the phase section.

10. The laser system according to claim 7, wherein the wavelength locking mode is deactivated for a period during the channel setting mode.

* * * * *

UNITED STATES PATENT AND TRADEMARK OFFICE
CERTIFICATE OF CORRECTION

| | | |
|---|---|---|
| PATENT NO. | : 7,339,962 B2 | Page 1 of 1 |
| APPLICATION NO. | : 10/489115 | |
| DATED | : March 4, 2008 | |
| INVENTOR(S) | : Farrell et al. | |

It is certified that error appears in the above-identified patent and that said Letters Patent is hereby corrected as shown below:

Title Page:

Item [73], Assignee, please delete "Interuniversitair Microelektronics Centrum (IMEC), Leuven, (BE)" and add -- Intune Technologies Limited, Dublin, (IE) --

Signed and Sealed this

Twenty-fifth Day of May, 2010

David J. Kappos
*Director of the United States Patent and Trademark Office*